(12) United States Patent
Yoon et al.

(10) Patent No.: US 9,218,764 B2
(45) Date of Patent: Dec. 22, 2015

(54) DISPLAY DEVICE INCLUDING DRIVING UNIT

(71) Applicant: LG DISPLAY CO., LTD., Seoul (KR)

(72) Inventors: Joong-Sun Yoon, Paju-si (KR); Soon-Il Yun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 254 days.

(21) Appl. No.: 13/928,131

(22) Filed: Jun. 26, 2013

(65) Prior Publication Data

US 2014/0175977 A1    Jun. 26, 2014

(30) Foreign Application Priority Data

Dec. 24, 2012    (KR) ........................ 10-2012-0152182

(51) Int. Cl.
| | |
|---|---|
| *H01J 7/44* | (2006.01) |
| *H01J 13/16* | (2006.01) |
| *H01J 17/34* | (2006.01) |
| *H01J 19/78* | (2006.01) |
| *H01J 23/16* | (2006.01) |
| *H01J 29/96* | (2006.01) |
| *H01J 1/62* | (2006.01) |
| *G09G 3/32* | (2006.01) |
| *H01L 27/32* | (2006.01) |

(52) U.S. Cl.
CPC ............ *G09G 3/3225* (2013.01); *G09G 3/3208* (2013.01); *H01L 27/3276* (2013.01); *G09G 2300/0426* (2013.01)

(58) Field of Classification Search
CPC ................................ G09G 3/32; G09G 3/3225
USPC ............................................................ 315/51
See application file for complete search history.

(56) References Cited

U.S. PATENT DOCUMENTS

| | | | |
|---|---|---|---|
| 6,037,654 A | 3/2000 | Tamura | |
| 2002/0134578 A1* | 9/2002 | Hwang et al. | ................. 174/255 |
| 2004/0169645 A1 | 9/2004 | Sakaki | |
| 2006/0139255 A1* | 6/2006 | Kim et al. | ........................ 345/76 |
| 2007/0018168 A1 | 1/2007 | Oh et al. | |
| 2007/0117415 A1 | 5/2007 | Shikina | |
| 2008/0048948 A1* | 2/2008 | Koh et al. | ........................ 345/80 |
| 2008/0143699 A1 | 6/2008 | Hirama | |

* cited by examiner

*Primary Examiner* — Sibin Chen
*Assistant Examiner* — Metasebia Retebo
(74) *Attorney, Agent, or Firm* — Birch, Stewart, Kolasch & Birch, LLP (57) ABSTRACT

A display device according to an embodiment includes a display panel including a display area having pixel areas, and a non-display area surrounding the display area. The display area includes first power lines for providing a first power to the pixel areas. The display device further includes a driver electrically connected to the first power lines of the display panel. The driver includes a driving integrated circuit, signal output pads connected to the driving integrated circuit and configured to output signals, a power supply line disposed outside the signal output pads and configured to supply the first power, and power output pads connected to the power supply line and configured to output the first power from the power supply line to the first power lines, wherein the power output pads are alternatingly disposed with the signal output pads.

18 Claims, 6 Drawing Sheets

*(RELATED ART)*

*FIG. 1*

(RELATED ART)

DISPLAY DEVICE INCLUDING DRIVING UNIT

The present application claims the priority benefit of Korean Patent Application No. 10-2012-0152182 filed in the Republic of Korea on Dec. 24, 2012, which is hereby incorporated by reference in its entirety.

BACKGROUND

1. Field of the Disclosure

The present disclosure relates to a display device, and more particularly, to a display device including a driving unit having power output pads between data or gate signal output pads.

2. Discussion of the Related Art

An organic light-emitting diode (OLED) display device, which is one of flat panel displays (FPDs), has the characteristics of high brightness and a low operating voltage.

The OLED display device generally has a high contrast ratio since it is a self-luminous device, can be implemented as an ultra thin display, can easily reproduce moving pictures due to its response time of several microseconds (μs), has no limitation of a viewing angle, and can stably operate at a low temperature. Also, since the OLED display device can be driven at a low direct current voltage of 5V to 15V, it is easy to manufacture and design a driving circuit with the OLED display device.

Furthermore, the OLED display device can be manufactured through a simple manufacturing process including only deposition and encapsulation.

However, since the OLED display device has a current mode of emitting light by supplying electric current to light-emitting diodes, it is necessary to supply various high voltages to individual pixel areas through an integrated power line.

The integrated power line of the OLED display device will be described with reference to FIGS. 1 and 2. Particularly, FIG. 1 is a view of showing a related art OLED display device, and FIG. 2 is an enlarged view of an area A of FIG. 1 with second integrated power lines 52 not shown.

Figure 1:
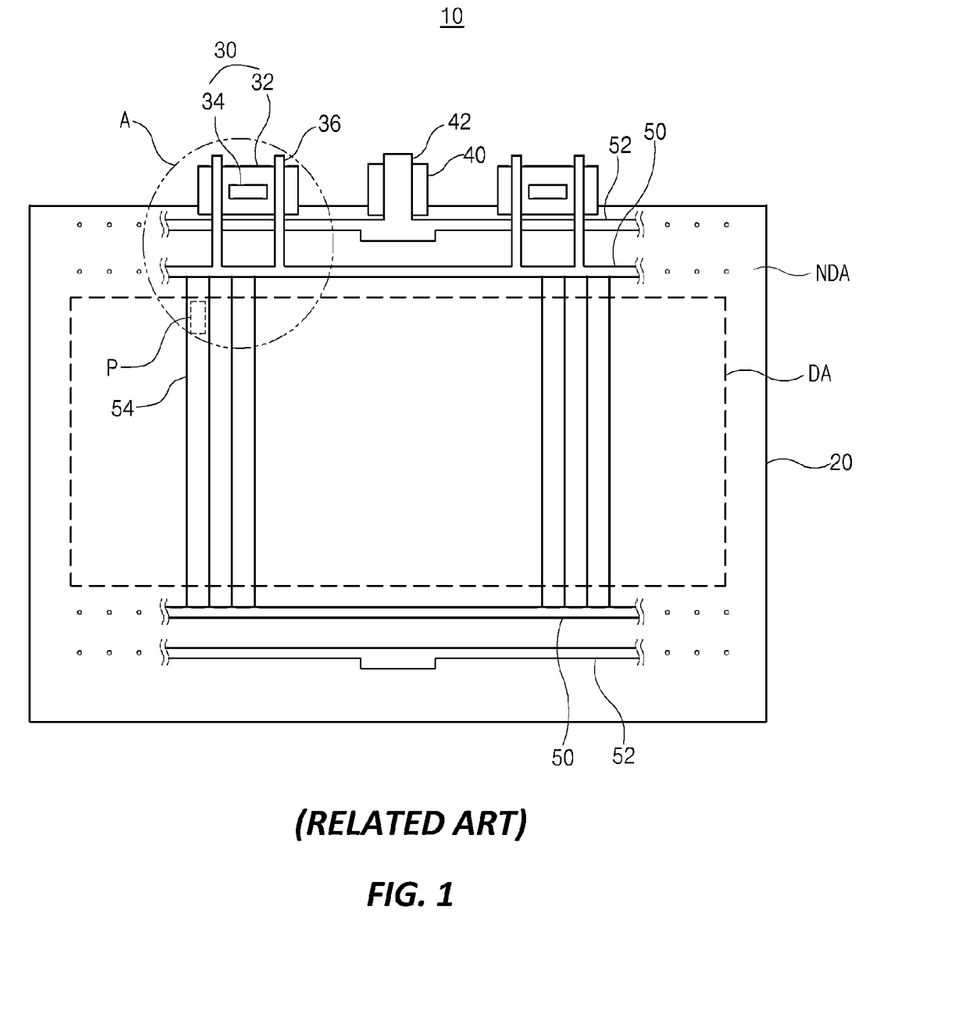
FIG. 1 is a view showing a related art OLED display device.

As shown in FIG. 1, the related art OLED display device 10 includes a light-emitting diode panel 20 which displays images, and a plurality of gate drivers (not shown) and a plurality of data drivers 30 which are connected to the light-emitting diode panel 20 to supply gate signals and data signals, respectively.

The light-emitting diode panel 20 includes a display area DA having a plurality of pixel areas P, and a non-display area NDA surrounding the display area DA. The display area DA includes a plurality of first power lines 54 for supplying a first voltage to the plurality of pixel areas P (e.g., P1, P2, etc.). The non-display area NDA includes first integrated power lines 50 connected to the first power lines 54 to transmit the first voltage provided from an external circuit via the data drivers 30 to the first power lines 54.

Figure 2:
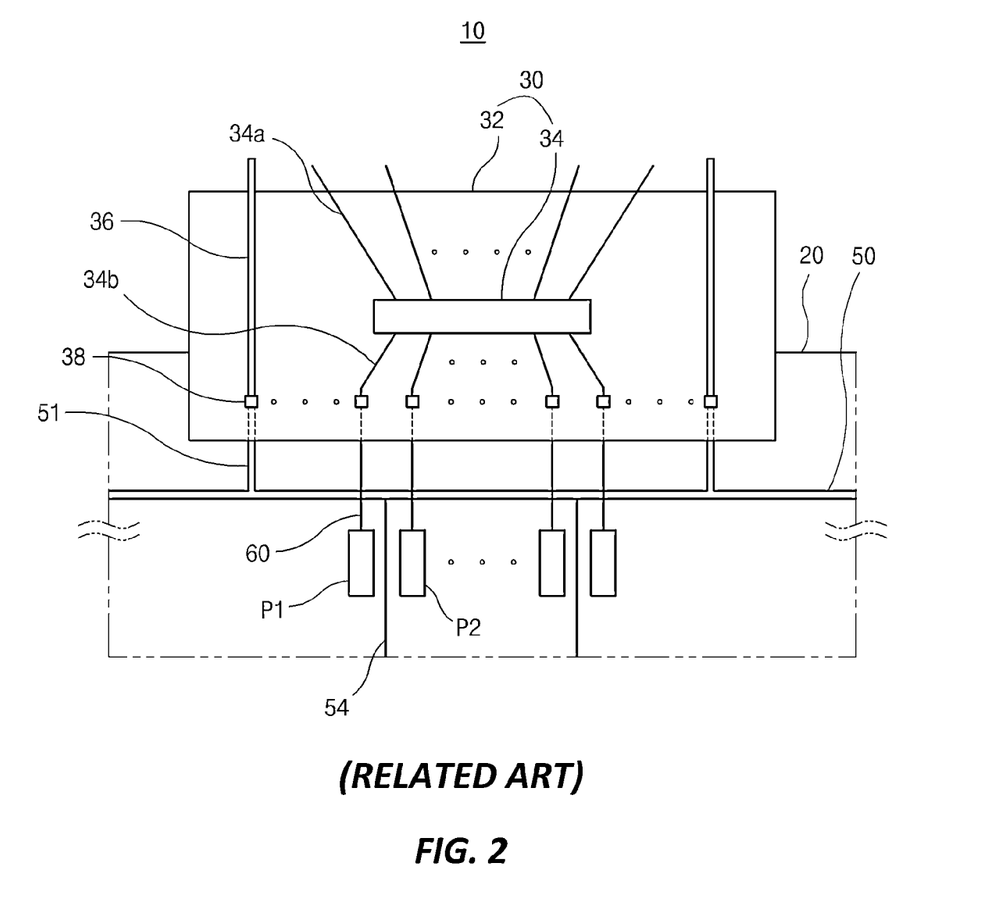
FIG. 2 is an enlarged view of an area A of FIG. 1.

Although not shown in FIGS. 1 and 2, the display area DA further includes a plurality of second power lines for supplying a second voltage to the pixel areas P. The non-display area NDA further includes the second integrated power lines 52 connected to the second power lines to transmit the second voltage from an external circuit to the second power lines.

Each data driver 30 may be formed in the form of a chip on film (COF) in which a driving integrated circuit (DIC) 34 is mounted on a film 32, like a tape carrier package (TCP).

Further, first power supply lines 36, to which the first voltage from the external circuit is supplied, are formed at both ends of each data driver 30, and the first power supply lines 36 are connected to one of the first integrated power lines 50.

Also, a transmission unit 40 such as a film on glass (FOG) may be connected to the light-emitting diode panel 20, and a second power supply line 42 is formed on the transmission unit 40 and is connected to one of the second integrated power lines 52.

In more detail, as shown in FIG. 2, each of the plurality of data drivers 30 includes a film 32 and a driving integrated circuit 34 mounted on the film 32. A plurality of data input lines 34a, a plurality of data output lines 34b, the first power supply lines 36, and a plurality of output pads 38 are formed on the film 32.

The data input lines 34a input image data and data control signals supplied from the external circuit to the driving integrated circuit 34. The data output lines 34b transmit a plurality of data signals outputted from the driving integrated circuit 34 to the light-emitting diode panel 20. The first power supply lines 36 are formed at both sides of each driving integrated circuit 34 and transmit the first voltage provided from the external circuit to the light-emitting diode panel 20.

In addition, the output pads 38 are connected to one ends of the data output lines 34b and the first power supply lines 36.

Here, the data input lines 34a, the data output lines 34b and the first power supply lines 36 are formed between two insulating layers of the film 32 as electric lines. The output pads 38 are exposed through a lower surface of the film 32 and contact lines of the light-emitting diode panel 20.

Meanwhile, the first integrated power lines 50, power supply lines 51, the plurality of first power lines 54, and the plurality of data lines 60 are formed in the light-emitting diode panel 20.

The power supply lines 51 are connected to the output pads 38, which contact the one ends of the first power supply lines 36, and one of the first integrated power lines 50 to transmit the first voltage from the first power supply lines 36 to the corresponding first integrated power line 50. Each of the plurality of first power lines 54, which is formed between adjacent first and second pixel areas P1 and P2, is connected to the first integrated power lines 50 and is supplied with the first voltage.

The data lines 60 are connected to the output pads 38, which contact the data output lines 34b, and the pixel areas P, and transmit the data signals from the data output lines 34b to the pixel areas P.

In the related art OLED display device 10, the first and second voltages may be a supply voltage VDD and a ground voltage VSS, respectively. Since the first and second voltages are supplied to all of the pixel areas P of the light-emitting diode panel 20 through one first integrated power line 50 and one second integrated power line 52, an excessive amount of current flows through the first integrated power line 50 and the second integrated power line 52. For instance, a single integrated power line 50 is connected to all of the power lines 54 of the entire pixel areas P of the light-emitting diode panel 20, and all the power supply lines 36 are connected to the single integrated power line 50. In the related art OLED display device 10, both the first and second integrated power lines 50 and 52 are formed outside the film 32 and are not formed on or under the film 32.

Accordingly, the first integrated power line 50 and the second integrated power line 52 may be electrically open or burned, or electrically shorted with other lines due to the breakdown of their upper or lower insulating layers, which can degrade the performance of the OLED display device 10. Further the failure of the first integrated power line 50 and/or the second integrated power line 52 may be propagated to the first power lines 54 or the second power lines, which can further degrade the performance of the OLED display device 10.

In particular, in the case of a large sized OLED display requiring a larger amount of driving current, such a failure becomes a serious problem.

SUMMARY OF THE INVENTION

Accordingly, the present invention is directed to a display device that substantially obviates one or more of the problems due to limitations and disadvantages of the related art.

An object of the present disclosure is to provide a display device including a driving unit that is capable of preventing a failure such as an electrical shortage or burning of a panel by alternately forming data or gate signal output pads and power output pads between a driving integrated circuit and a power supply line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided according to an embodiment a display device including a display panel including a display area having a plurality of pixel areas and a non-display area surrounding the display area, wherein a plurality of first power lines for providing a first voltage to the plurality of pixel areas are formed in the display area; and a driver connected to the display panel, and including a driving integrated circuit, a plurality of output pads connected to the driving integrated circuit, a plurality of power output pads outputting the first power and alternating with the plurality of output pads, and a power supply line disposed outside the plurality of output pads and connected to the plurality of power output pads to supply the first voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 3:
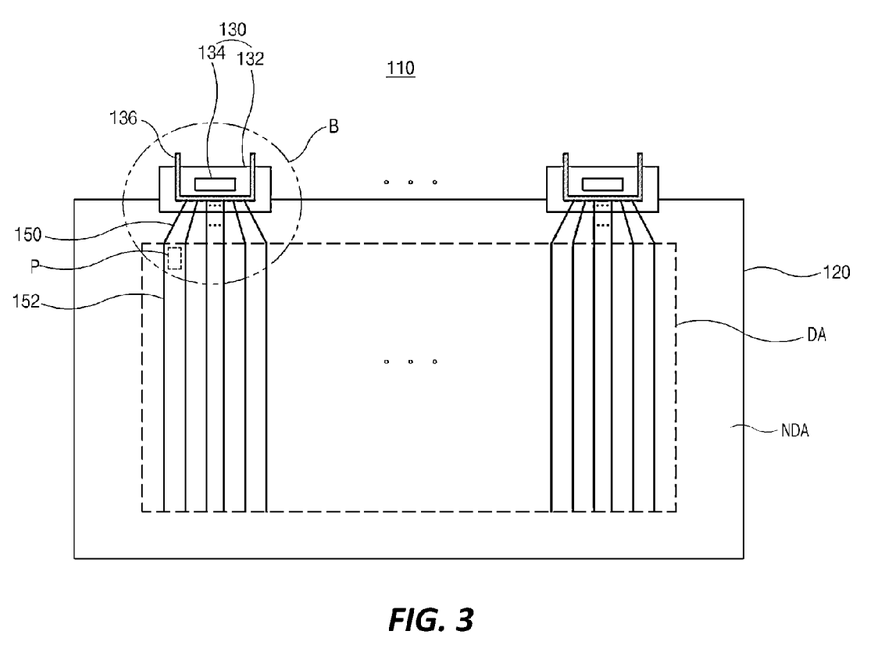
FIG. 3 is a view showing an OLED display device according to a first embodiment of the present invention.
Figure 4:
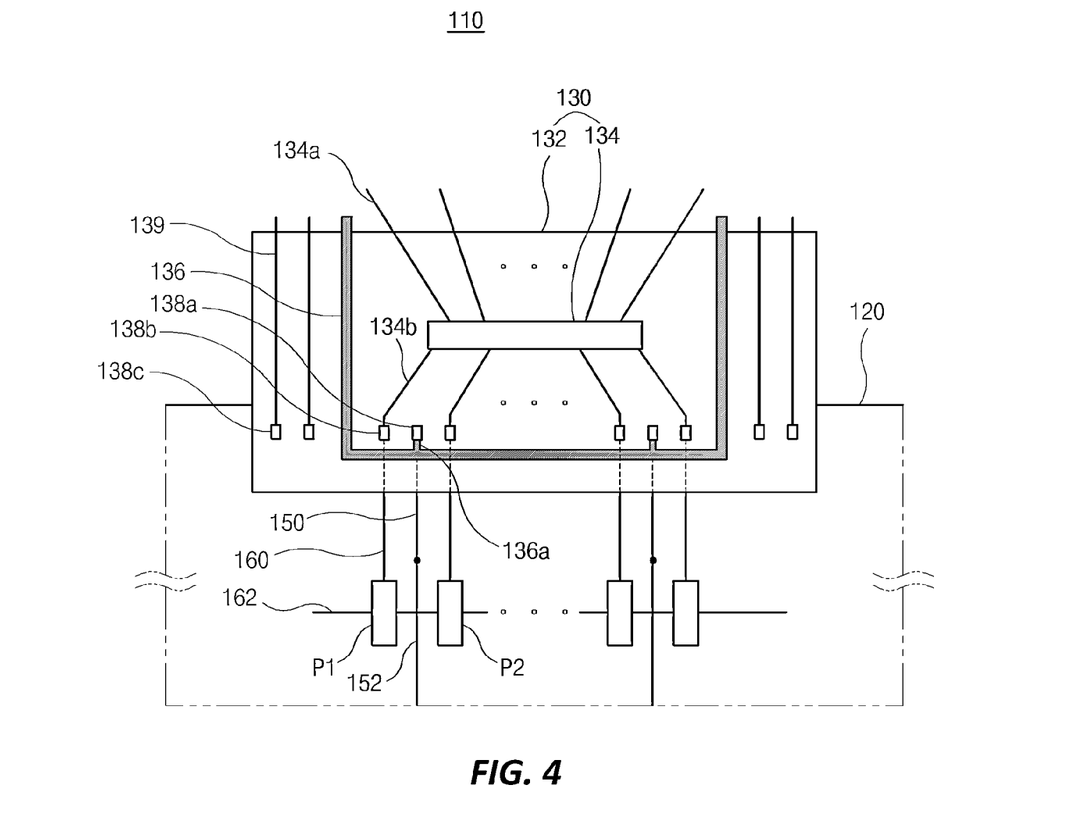
FIG. 4 is an enlarged view of an area B of FIG. 3.

FIG. 3 is a view of showing an organic light-emitting diode (OLED) display device according to a first embodiment of the present invention, and FIG. 4 is an enlarged view of an area B of FIG. 3. All components of the OLED display device in this embodiment and other embodiments are operatively coupled and configured.

As shown in FIG. 3, the OLED display device 110 according to the first embodiment of the present invention includes a light-emitting diode panel 120 displaying images and a plurality of gate drivers (not shown) and a plurality of data drivers 130 connected to the light-emitting diode panel 120 to supply gate signals and data signals, respectively, as a driving unit.

The light-emitting diode panel 120 includes first and second substrates that have a display area DA having a plurality of pixel areas P and a non-display area NDA surrounding the display area DA. In the display area DA of the first substrate, a plurality of first power lines 152 for supplying a first voltage to the plurality of pixel areas P are formed to correspond to a length of the display area DA along a vertical direction in the context of the figure. The display area DA in this embodiment and other embodiments further includes other components known in the art for displaying images. In the non-display area NDA of the first substrate, a plurality of first power link lines 150 respectively connected to the first power lines 152 are formed and transmit the first voltage from an external circuit to the first power lines 152. The non-display area DNA in this embodiment and other embodiments also includes other components known in the art for supporting the display area DA.

Additionally, a plurality of second power lines for supplying a second voltage to the pixel areas P may be formed in the display area DA of the first substrate, and a plurality of second power link lines connected to the second power lines to transmit the second voltage from an external circuit to the second power lines may be additionally formed in the non-display area (NDA) of the first substrate.

Each data driver 130 may be formed in the form of a chip on film (COF) in which a driving integrated circuit (DIC) 134 is mounted on a film 132, like a tape carrier package (TCP). For example, the driving integrated circuit 134 may include digital-analog converters (DACs), output buffers, and so on.

Here, a power supply line 136 is formed on the film 132 of each data driver 130 and is supplied with the first voltage from the external circuit. Each of the power supply lines 136 has a U-like shape structure surrounding the corresponding driving integrated circuit 134. As a variation, each power supply line 136 can have other shapes that surround substantially the corresponding driving integrated circuit 134. Each power supply line 136 is connected to a group of the first power link lines 150 of the light-emitting diode panel 120 to supply the first voltage to the corresponding first power link lines 150.

Also, a plurality of additional power supply lines for the second voltage to which the second voltage from the external circuit is supplied may be added at both ends of the film 132 of each data driver 130, and the additional power supply lines may be connected to the second power link lines of the light-emitting diode panel 120, respectively.

In more detail, as shown in FIG. 4, each data driver 130 includes a film 132 and a driving integrated circuit 134 mounted on the film 132. A plurality of data input lines 134a, a plurality of data output lines 134b, a power supply line 136, a plurality of power connection lines 136a, a plurality of power output pads 138a, a plurality of data output pads 138b, a plurality of dummy pads 138c, and a plurality of dummy lines 139 are formed on the film 132 of each data driver 130. The data output pad 138b is an example of a signal output pad.

The data input lines 134a input image data and data control signals supplied from the external circuit to the driving integrated circuit 134. The data output lines 134b transmit a plurality of data signals outputted from the driving integrated circuit 134 to the light-emitting diode panel 120.

Each power supply line 136 has a U-like or other shaped structure surrounding substantially the driving integrated circuit 134 and is supplied with the first power from the external circuit. Specially, each power supply line 136 is placed outside the corresponding power output pads 138a and the data output pads 138b, and thus the power output pads 138a and the data output pads 138b are disposed between the data output lines 134b and the power supply line 136. In a preferred example, all the power supply lines 136 of the OLED display device 110 receive the same voltage/power.

In addition, for each power supply line 136, the power supply line 136 is disposed and extends between the data input lines 134a and the dummy lines 139 and between the data output lines 134b and the dummy lines 139.

The power connection lines 136a are connected to the power supply line 136. The power connection lines 136a may extend from the power supply line 136 toward the power output pads 138a and may be placed outside the power output pads 138a and the data output pads 138b.

The dummy lines 139 are lines for transmitting additional signals or voltages for each model. The dummy lines 139 may transmit the second power supplied from the external circuit to the light-emitting diode panel 120.

The power output pads 138a are connected to one ends of the power connection lines 136a, the data output pads 138b are connected to one ends of the data output lines 134b, and the dummy pads 138c are connected to one ends of the dummy lines 139.

The power output pads 138a and the data output pads 138b are alternatingly disposed with respect to each other as shown in FIG. 4. The present invention encompasses various other alternating configurations. For instance, being alternatingly disposed according to the invention can mean various configurations of one or more power output pads 138a being adjacent to one or more data output pads 138b. This can include one-to-one alternating between the power output pads 138a and the data output pads 138b (as shown in FIG. 4), or one-to-many or many-to-many alternating between the power output pads 138a and the data output pads 138b. For instance, the one-to-many alternating configuration can include a repetition of a pattern composed of a power output pad, a data output pad, and a data output pad disposed adjacent to each other in that order in a specific direction. The many-to-many alternating configuration can include a repetition of a pattern composed of a power output pad, a power output pad, a data output pad and a data output pad disposed adjacent to each other in that order in a specific direction. Further, the alternating configurations can include one or more repetitions of the same one alternating pattern or of different alternating patterns, or can include no specific pattern (e.g., randomly alternating) in the alternating configuration. In one case, for instance, the number of power output pads 138a may be equal to or less than the number of the data output pads 138b. Further, all these alternating configurations are equally applicable to gate drivers 230 of FIG. 6 (to be described later below) such that power output pads 238a (of the gate drivers 230) and gate output pads 238b can be alternatingly disposed in the same or similar manner as those described above for the data output pads 138b and the power output pads 138a.

Here, the data input lines 134a, the data output lines 134b, the power supply line 136, the power connection lines 136a, and the dummy lines 139 are formed between two insulating layers of the film 132 as electric lines insulated from each other. The power output pads 138a, the data output pads 138b and the dummy pads 138c may be exposed through a lower surface of the film 132 and contact the lines of the light-emitting diode panel 120.

Particularly, since the power supply line 136 and the power connection lines 136a are placed outside the power output pads 138a and the data output pads 138b, the power supply line 136 and the power connection lines 136a do not cross or overlap the data output lines 134b which are disposed inside the power output pads 138a and the data output pads 138b.

One of the advantages of the embodiments of the present invention is that the data output lines 134b connected to the driving integrated circuit 134 do not cross the power supply line 136. To accomplish this, the data output pads 138b are placed between the driving integrated circuit 134 and the power supply line 136. There may be various modifications in the structure that satisfies this factor.

For example, in another example, the data output pads 138b may be disposed between the driving integrated circuit 134 and the power supply line 136 by placing the power connection lines 136a and the power output pads 138a outside the power supply line 136, and the power supply line 136 may be disposed between the data output pads 138b and the power output pads 138a.

Accordingly, the power supply line 136, the power connection lines 136a and the data output lines 134b may be formed as a single layer. The data input lines 134a and the dummy lines 139 may be also formed as a single layer.

In the meantime, a plurality of first power link lines 150, a plurality of first power lines 152, a plurality of data lines 160, and a plurality of gate lines 162 are formed in the light-emitting diode panel 120.

The first power link lines 150 are connected to the power output pads 138a of the one ends of the power connection lines 136a and the first power lines 152 to transmit the same first voltage from the power supply line 136 to the first power lines 152.

Each of the first power lines 152 may be formed between first and second pixel areas P1 and P2 adjacent to each other and receive the first voltage from the power supply line 136 through the corresponding first power link line 150.

In case that the dummy lines 139 transmit the second voltage, a plurality of second power link lines connected to the dummy pads 138c of the one ends of the dummy lines 139 may be further formed in the light-emitting diode panel 120. At this time, the first and second voltages may be a supply voltage VDD and a ground voltage VSS, respectively.

The data lines 160 are connected to the data output pads 138b of the one ends of the data output lines 134b and the pixel areas (e.g., P1 and P2) and transmit the data signals from the data output lines 134b to the pixel areas. The gate lines 162 are connected to the pixel areas and transmit the gate signals from the gate drivers to the pixel areas. Therefore, the pixel areas display an image using the gate signals, the data signals and the first voltage.

In the OLED display device 110 according to the first embodiment of the present invention, the power output pads 138a of the data drivers 130 are arranged to alternate with the data output pads 138b and thus dividedly provide the first voltage to the light-emitting diode panel 120. Further, each data driver 130 has its own power supply line 136 which is not connected to other adjacent power supply lines 136. Thus, the integrated power line used in the related art for supplying the first voltage can be omitted in the light-emitting diode panel 120 of the present invention. As a result, failures such as electrically opening or burning or electrical shortage can be prevented or minimized in the display devices of the present invention.

Moreover, since the first voltage can be dividedly provided by additionally forming just the power supply line 136, the power connection lines 136a and the power output pads 138a on the film 132 without a change in the inner structure of the driving integrated circuits 134 and the arrangement of a plurality of output pins, the design costs for a new driving integrated circuit and manufacturing costs can be decreased or minimized.

Furthermore, the power supply line 136 and the power connection lines 136b are disposed outside the power output pads 138a and the data output pads 138b, and the data output lines 134b connected to the output pins of the driving integrated circuit 134 are disposed inside of the power output pads 138a and the data output pads 138b. Therefore, it is possible to design the power supply line 136 and the data output lines 134b that do not cross each other.

Accordingly, the power supply line 136 and the data output lines 134b can be formed as a single layer, and thus an increase in the size of the data drivers 130 is minimized.

Meanwhile, in another embodiment, a power supply line and power output pads may be formed in gate drivers. This will be described with reference to FIGS. 5 and 6. The invention also encompasses an OLED display device which may include all the configurations of FIGS. 3-6 in one device if desired.

Figure 5:
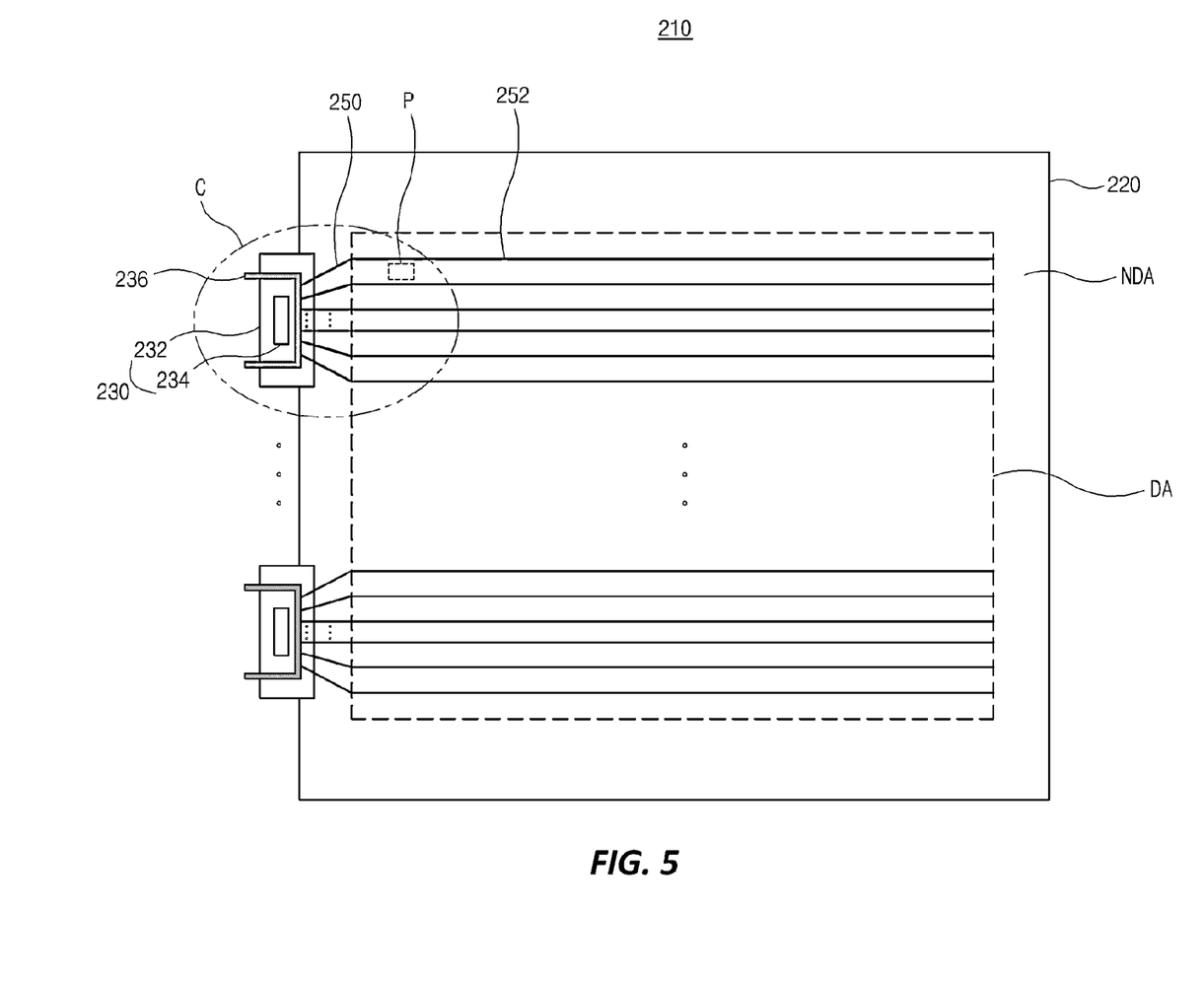
FIG. 5 is a view showing an OLED display device according to a second embodiment of the present invention.
Figure 6:
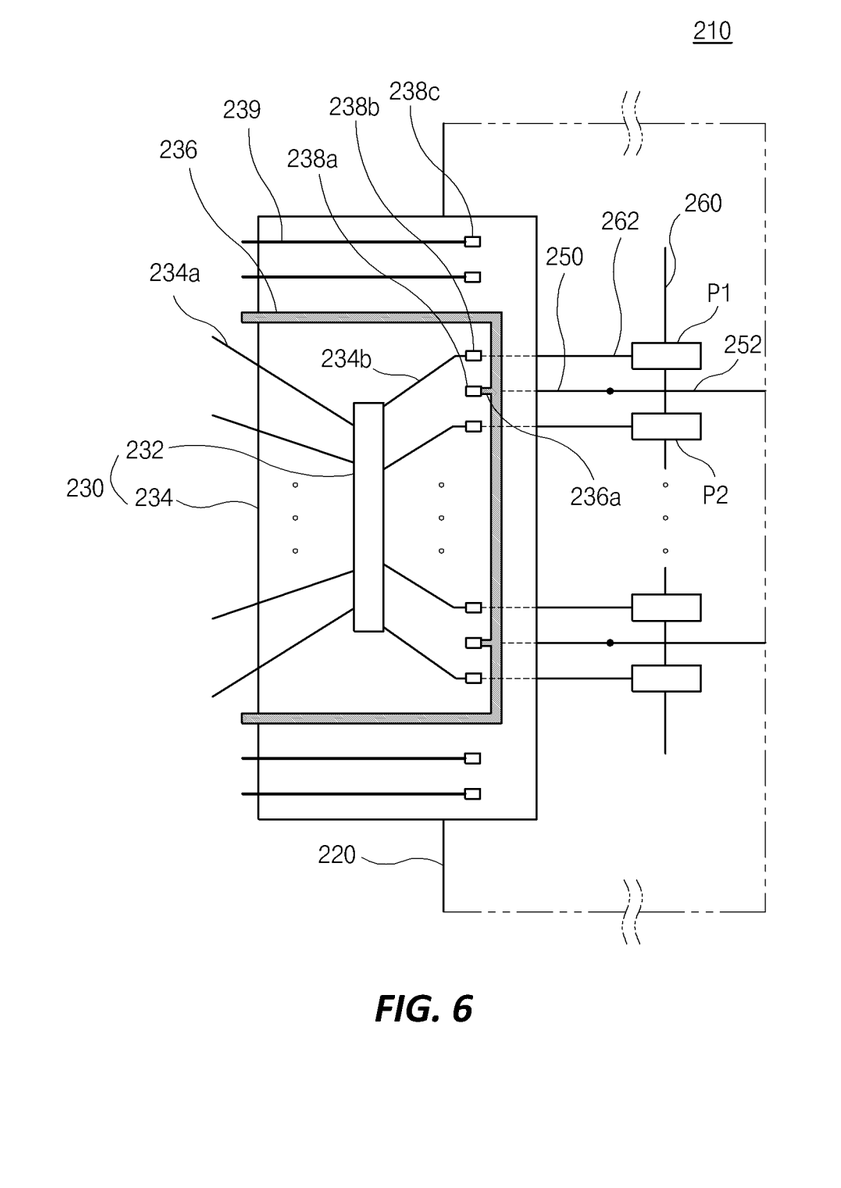
FIG. 6 is an enlarged view of an area C of FIG. 5.

FIG. 5 is a view of showing an OLED display device according to a second embodiment of the present invention, and FIG. 6 is an enlarged view of an area C of FIG. 5. Even if not specifically mentioned below, all the various features discussed above in connection with the first embodiment are equally applicable and can be part of the OLED display device of the second embodiment.

As shown in FIG. 5, the OLED display device 210 according to the second embodiment of the present invention includes a light-emitting diode panel 220 displaying images and a plurality of gate drivers 230 and a plurality of data drivers (not shown) connected to the light-emitting diode panel 220 to supply gate signals and data signals, respectively, as a driving unit.

The light-emitting diode panel 220 includes first and second substrates that have a display area DA having a plurality of pixel areas P and a non-display area NDA surrounding the display area DA. In the display area DA of the first substrate, a plurality of first power lines 252 for supplying a first voltage to the plurality of pixel areas P are formed to correspond to a length of the display area DA along a horizontal direction in the context of the figure. In the non-display area NDA of the first substrate, a plurality of first power link lines 250 connected to the first power lines 252 are formed and transmit the first voltage from an external circuit to the first power lines 252.

A plurality of second power lines for supplying a second voltage to the pixel areas P may be additionally formed in the display area DA of the first substrate, and a plurality of second power link lines connected to the second power lines to transmit the second voltage from an external circuit to the second power lines may be additionally formed in the non-display area (NDA) of the first substrate.

Each gate driver 230 may be formed in the form of a chip on film (COF) in which a driving integrated circuit (DIC) 234 is mounted on a film 232, like a tape carrier package (TCP). For example, the driving integrated circuit 234 may include shift registers, level shifters, output buffers, and so on.

Here, a power supply line 236 is formed on the film 232 of each gate driver 230 and is provided with the first voltage from the external circuit. The power supply line 236 has a U-like shaped or other shaped structure surrounding substantially the driving integrated circuit 234. The power supply line 236 is connected to the first power link lines 250 of the light-emitting diode panel 220 to supply the first voltage to the first power link lines 250.

Also, a plurality of additional power supply lines for the second voltage to which the second voltage from the external circuit is supplied may be added at both ends of the film 232 of each gate driver 230, and the additional power supply lines may be connected to the second power link lines of the light-emitting diode panel 220, respectively.

In more detail, as shown in FIG. 6, each gate driver 230 includes a film 232 and a driving integrated circuit 234 mounted on the film 232. A plurality of gate input lines 234a, a plurality of gate output lines 234b, a power supply line 236, a plurality of power connection lines 236a, a plurality of power output pads 238a, a plurality of gate output pads 238b, a plurality of dummy pads 238c, and a plurality of dummy lines 239 are formed on the film 232 of each gate driver 230. The gate output pad 238b is an example of a signal output pad.

For each gate driver 230, the gate input lines 234a input gate control signals supplied from the external circuit into the driving integrated circuit 234. The gate output lines 234b transmit a plurality of gate signals and a plurality of reset signals outputted from the driving integrated circuit 234 to the light-emitting diode panel 220.

The power supply line 236 has a U-like shape or other shape surrounding the driving integrated circuit 234 and is supplied with the first power from the external circuit. Specially, the power supply line 236 is placed outside the power output pads 238a and the gate output pads 238b, and thus the power output pads 238a and the gate output pads 238b are disposed between the gate output lines 234b and the power supply line 236.

In addition, the power supply line 236 is disposed between the gate input lines 234a and the dummy lines 239 and between the gate output lines 234b and the dummy lines 239.

The power connection lines 236a are connected to the power supply line 236. The power connection lines 236a may extend from the power supply line 236 toward the power output pads 238a and may be placed outside the power output pads 238a and the gate output pads 238b.

The dummy lines 239 are lines for transmitting additional signals or voltages for each model. The dummy lines 239 may transmit the second power supplied from the external circuit to the light-emitting diode panel 220.

The power output pads 238a are connected to one ends of the power connection lines 236a, the gate output pads 238b are connected to one ends of the gate output lines 234b, and the dummy pads 238c are connected to one ends of the dummy lines 239.

The power output pads 238a and the gate output pads 238b alternate with each other. For instance, the number of power output pads 238a may be equal to or less than the number of the gate output pads 238b.

Here, the gate input lines 234a, the gate output lines 234b, the power supply line 236, the power connection lines 236a, and the dummy lines 239 are formed between two insulating layers of the film 232 as electric lines insulated from each other. The power output pads 238a, the gate output pads 238b and the dummy pads 238c may be exposed through a lower surface of the film 232 and contact lines of the light-emitting diode panel 220.

Particularly, since the power supply line 236 and the power connection lines 236a are placed outside the power output pads 238a and the gate output pads 238b, the power supply line 236 and the power connection lines 236a do not cross or overlap the gate output lines 234b which are disposed inside the power output pads 238a and the gate output pads 238b.

One advantage of the second embodiment of the invention is that the gate output lines 234b connected to the driving integrated circuit 234 should not and do not cross the power supply line 236. To accomplish this, the gate output pads 238b are placed between the driving integrated circuit 234 and the power supply line 236. There may be various modifications in the structure that satisfies the essential factor.

For example, in another example, the gate output pads 238b may be disposed between the driving integrated circuit 234 and the power supply line 236 by placing the power connection lines 236a the power output pads 238a outside the power supply line 236, and the power supply line 236 may be disposed between the gate output pads 238b and the power output pads 238a.

Accordingly, the power supply line 236, the power connection lines 236a and the gate output lines 234b may be formed as a single layer. The gate input lines 234a and the dummy lines 239 may be also formed as a single layer.

In the meantime, a plurality of first power link lines 250, a plurality of first power lines 252, a plurality of data lines 260, and a plurality of gate lines 262 are formed in the light-emitting diode panel 220.

The first power link lines 250 are connected to the power output pads 238a of the one ends of the power connection lines 236a and the first power lines 252 to transmit the first voltage from the power supply line 236 to the first power lines 252. In a preferred example, all the power supply lines 236 of the OLED display device 210 receive the same voltage/power.

Each of the first power lines 252 may be formed between first and second pixel areas P1 and P2 adjacent to each other and receive the first voltage from the power supply line 236 through the corresponding first power link line 250.

In case that the dummy lines 239 transmit the second voltage, a plurality of second power link lines connected to the dummy pads 238c of the one ends of the dummy lines 239 may be further formed in the light-emitting diode panel 220. At this time, the first and second voltages may be a supply voltage VDD and a ground voltage VSS, respectively.

The data lines 260 are connected to the pixel areas and transmit the data signals from the data drivers to the pixel areas. The gate lines 262 are connected to the gate output pads 238b of the one ends of the gate output lines 234b and the pixel areas and transmit the gate signals and the reset signals from the gate output lines 234b to the pixel areas. Therefore, the pixel areas display an image using the gate signals, the data signals and the first voltage.

In the OLED display device 210 according to the second embodiment of the present invention, the power output pads 238a of the gate drivers 230 are arranged to alternate with the gate output pads 238b and dividedly provide the first voltage to the light-emitting diode panel 220. For instance, for each gate driver 230, the corresponding power output pads 238a and the corresponding output pads 238b are alternatingly disposed with respect to each other. Further, each gate driver 230 has its own power supply line 236 which is not connected to other adjacent power supply lines 236. Thus, the integrated power line used in the related art for supplying the first voltage can be omitted in the light-emitting diode panel 220 of the present invention. As a result, failures such as electrically opening or burning or electrical shortage can be prevented or minimized in the display devices of the present invention.

Moreover, since the first voltage can be dividedly provided by additionally forming just the power supply line 236, the power connection lines 236a and the power output pads 238a on the film 232 without a change in the inner structure of the driving integrated circuits 234 and the arrangement of a plurality of output pins, the design costs for a new driving integrated circuit and manufacturing costs can be decreased or minimized.

Furthermore, the power supply line 236 and the power connection lines 236b are disposed outside the power output pads 238a and the gate output pads 238b, and the gate output lines 234b connected to the output pins of the driving integrated circuit 234 are disposed inside of the power output pads 238a and the gate output pads 238b. Therefore, it is possible to design the power supply line 236 and the gate output lines 234b that do not cross each other.

Accordingly, the power supply line 236 and the gate output lines 234b can be formed as a single layer, and thus an increase in the size of the gate drivers 230 is minimized.

It will be apparent to those skilled in the art that various modifications and variations can be made in a display device of the present disclosure without departing from the spirit or scope of the invention. Thus, it is intended that the present invention covers the modifications and variations of this invention provided they come within the scope of the appended claims and their equivalents.

What is claimed is:

1. A display device, comprising:
   a display panel including a display area having a plurality of pixel areas, and a non-display area surrounding the display area, the display area including a plurality of groups of first power lines for providing a first power to the plurality of pixel areas; and
   a driver electrically connected to the plurality of first power lines of a particular group among the plurality of groups of first power lines,
   the driver including:
      a driving integrated circuit,
      a plurality of signal output pads connected to the driving integrated circuit and configured to output signals,
      a power supply line disposed outside the plurality of signal output pads and configured to supply the first power to the particular group of first power lines, wherein the power supply line has a structure that substantially surrounds the driving integrated circuit and the plurality of signal output pads, and
      a plurality of power output pads connected to the power supply line and configured to output the first power from the power supply line to the plurality of first power lines of the particular group, wherein the plurality of power output pads are alternatingly disposed with the plurality of signal output pads.

2. The display device according to claim 1, wherein the plurality of signal output pads and the plurality of power output pads are disposed between the driving integrated circuit and the power supply line.

3. The display device according to claim 1, wherein the plurality of signal output pads are disposed between the driving integrated circuit and the power supply line, and
   the power supply line is disposed between the plurality of signal output pads and a plurality of dummy pads.

4. The display device according to claim 1, wherein the driver further includes:
   a plurality of output lines for connecting the driving integrated circuit to the plurality of signal output pads, and a plurality of power connection lines for connecting the power supply line to the plurality of power output pads.

5. The display device according to claim 4, wherein the power supply line, the plurality of output lines and the plurality of power connection lines are formed between two insulating layers as a single layer.

6. The display device according to claim 1, wherein the number of the plurality of power output pads is equal to or less than the number of the plurality of signal output pads.

7. The display device according to claim 1, wherein the driver further includes:
a plurality of dummy lines formed at both ends of the driving integrated circuit, and
a plurality of dummy pads connected to the plurality of dummy lines, respectively.

8. The display device according to claim 7, wherein the plurality of dummy lines provide a second power to the display panel, and the first and second powers are a supply voltage VDD and a ground voltage VSS, respectively.

9. The display device according to claim 1, wherein the driver is either a data driver for supplying a data signal to the display panel or a gate driver for providing a gate signal to the display panel.

10. A display device, comprising:
a display panel including a display area for displaying images and a plurality of power lines disposed in the display area; and
a plurality of drivers, each of the drivers electrically connected to a different group of the power lines,
each of the drivers including:
a driving integrated circuit,
a power supply line configured to supply a first power to the corresponding group of the power lines,
a plurality of signal output pads configured to receive signals from the driving integrated circuit and supply the signals to the display area, and
a plurality of power output pads configured to supply the first power from the power supply line to the corresponding group of the power lines, wherein the power supply line has a structure that substantially surrounds the driving integrated circuit and the plurality of signal output pads, and
wherein at least one of the power output pads is disposed between the plurality of signal output pads.

11. The display device according to claim 10, wherein in each of the drivers,
the driving integrated circuit is disposed on a film,
the power supply line has a structure that substantially surrounds the driving integrated circuit, and
the entire structure of the power supply line is disposed on the film.

12. The display device according to claim 10, wherein all the power supply lines of the display device supply the same first power to the power lines.

13. The display device according to claim 10, wherein for each of the drivers, the plurality of signal output pads and the plurality of power output pads are disposed between the driving integrated circuit and the power supply line.

14. The display device according to claim 10, wherein each of the drivers further includes:
a plurality of output lines for connecting the driving integrated circuit to the plurality of signal output pads, and
a plurality of power connection lines for connecting the power supply line to the plurality of power output pads.

15. The display device according to claim 10, wherein for each of the drivers, the number of the plurality of power output pads is equal to or less than the number of the plurality of signal output pads.

16. The display device according to claim 10, wherein each of the drivers further includes:
a plurality of dummy lines formed at both ends of the driving integrated circuit, and
a plurality of dummy pads connected to the plurality of dummy lines, respectively.

17. The display device according to claim 16, wherein the plurality of dummy lines provide a second power to the display panel, and the first and second powers are a supply voltage VDD and a ground voltage VSS, respectively.

18. The display device according to claim 10, wherein the plurality of drivers are respectively one of the following:
a plurality of data drivers for supplying data signals to the display panel,
a plurality of gate drivers for providing gate signals to the display panel, or
the plurality of data drivers and the plurality of gate drivers.

* * * * *